United States Patent
Dong et al.

(10) Patent No.: US 9,357,679 B2
(45) Date of Patent: May 31, 2016

(54) ELECTRONIC EQUIPMENT COOLING SYSTEM WITH AUXILIARY COOLING DEVICE

(71) Applicant: Huawei Technologies Co., Ltd., Shenzhen (CN)

(72) Inventors: Yuan Dong, Shenzhen (CN); Liqian Zhai, Shenzhen (CN); Shanjiu Chi, Shenzhen (CN); Jun Zhao, Munich (DE)

(73) Assignee: Huawei Technologies Co., Ltd., Shenzhen (CN)

( * ) Notice: Subject to any disclaimer, the term of this patent is extended or adjusted under 35 U.S.C. 154(b) by 177 days.

(21) Appl. No.: 14/077,498

(22) Filed: Nov. 12, 2013

(65) Prior Publication Data
US 2014/0071621 A1    Mar. 13, 2014

Related U.S. Application Data

(63) Continuation of application No. PCT/CN2012/082411, filed on Sep. 29, 2012.

(30) Foreign Application Priority Data

Sep. 29, 2011   (CN) .......................... 2011 1 0295554

(51) Int. Cl.
  *H05K 7/20* (2006.01)
(52) U.S. Cl.
  CPC ........ *H05K 7/20581* (2013.01); *H05K 7/20727* (2013.01); *H05K 7/20736* (2013.01)
(58) Field of Classification Search
  CPC .......... H05K 7/20581; H05K 7/20727; H05K 7/20736
  USPC ................ 361/688–723; 165/80.1–80.3, 185; 454/184–186, 228–253
  See application file for complete search history.

(56) References Cited

U.S. PATENT DOCUMENTS

| | | |
|---|---|---|
| 3,626,251 A | 12/1971 | Vigue |
| 4,417,295 A | 11/1983 | Stuckert |

(Continued)

FOREIGN PATENT DOCUMENTS

| | | |
|---|---|---|
| CN | 101044808 A | 9/2007 |
| CN | 200955527 Y | 10/2007 |

(Continued)

OTHER PUBLICATIONS

Foreign Communication From a Counterpart Application, PCT Application No. PCT/CN2012/082411, Chinese Search Report dated Jan. 3, 2013, 6 pages.

(Continued)

*Primary Examiner* — Jayprakash N Gandhi
*Assistant Examiner* — Yahya Ahmad
(74) *Attorney, Agent, or Firm* — Conley Rose, P.C.; Grant Rodolph; Nicholas K. Beaulieu

(57) ABSTRACT

Embodiments of the present invention disclose an electronic equipment cooling system including: a cabinet; at least one electronic equipment chassis that is installed inside the cabinet; and an auxiliary cooling device including an air pressurizing device, an air supply plenum box, and an air-guiding device. The air supply plenum box is disposed on an inner side of the cabinet. The air pressurizing device is disposed at the top or bottom of the cabinet, and an air exhaust on a sidewall of the air pressurizing device is connected to a corresponding air intake on a sidewall of the air supply plenum box. The air-guiding device is installed inside the electronic equipment chassis, an air intake of the air-guiding device is connected to an air exhaust of the air supply plenum device, and an air exhaust of the air-guiding device faces a component inside the electronic equipment chassis.

14 Claims, 10 Drawing Sheets

(56) References Cited

U.S. PATENT DOCUMENTS

| | | |
|---|---|---|
| 6,525,936 B2 | 2/2003 | Beitelmal et al. |
| 7,361,081 B2 | 4/2008 | Beitelmal et al. |
| 2002/0055329 A1* | 5/2002 | Storck, Jr. .............. F24F 7/06 454/186 |
| 2004/0257766 A1* | 12/2004 | Rasmussen ........ H05K 7/20572 361/689 |
| 2005/0153649 A1* | 7/2005 | Bettridge ........... H05K 7/20736 454/188 |
| 2005/0276017 A1* | 12/2005 | Aziz ..................... H04Q 1/023 361/695 |
| 2007/0173189 A1* | 7/2007 | Lewis ............... H05K 7/20009 454/184 |
| 2007/0213000 A1* | 9/2007 | Day .................. H05K 7/20745 454/184 |
| 2008/0151496 A1* | 6/2008 | Lai ................... H05K 7/20572 361/695 |
| 2008/0180903 A1* | 7/2008 | Bisson .............. H05K 7/20736 361/679.49 |
| 2008/0232066 A1* | 9/2008 | Wu .................. H05K 7/20727 361/690 |
| 2009/0061755 A1* | 3/2009 | Calder .............. H05K 7/20736 454/184 |
| 2010/0003911 A1* | 1/2010 | Graczyk ........... H05K 7/20736 454/184 |
| 2010/0097752 A1* | 4/2010 | Doll ................. H05K 7/20736 361/679.48 |
| 2010/0172093 A1* | 7/2010 | Davis ............... H05K 7/20736 361/694 |
| 2010/0317278 A1* | 12/2010 | Novick ............. H05K 7/20836 454/184 |
| 2011/0103010 A1* | 5/2011 | Zhang ................... G06F 1/20 361/679.49 |
| 2011/0122573 A1 | 5/2011 | Peng et al. |
| 2011/0267775 A1* | 11/2011 | VanDerVeen ...... H05K 7/20736 361/692 |
| 2013/0267160 A1* | 10/2013 | Hung ................ H05K 7/20736 454/184 |

FOREIGN PATENT DOCUMENTS

| | | |
|---|---|---|
| CN | 201440775 U | 4/2010 |
| CN | 201541421 U | 8/2010 |
| CN | 201657580 U | 11/2010 |

OTHER PUBLICATIONS

Foreign Communication From a Counterpart Application, PCT Application No. PCT/CN2012/082411, Chinese Written Opinion dated Jan. 3, 2013, 6 pages.

Partial English Translation and Abstract of Chinese Patent Application No. CN201440775U, Dec. 15, 2014, 9 pages.

Partial English Translation and Abstract of Chinese Patent Application No. CN201657580U, Dec. 15, 2014, 6 pages.

Foreign Communication From a Counterpart Application, Chinese Application No. 2011010295554.5, Chinese Office Action dated Dec. 1, 2014, 6 pages.

* cited by examiner

US 9,357,679 B2

ELECTRONIC EQUIPMENT COOLING SYSTEM WITH AUXILIARY COOLING DEVICE

CROSS-REFERENCE TO RELATED APPLICATIONS

This application is a continuation of International Application No. PCT/CN2012/082411, filed on Sep. 29, 2012, which claims priority to Chinese Patent Application No. 201110295554.5, filed on Sep. 29, 2011, both of which are hereby incorporated by reference in their entireties.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates to the field of cooling technologies for a cabinet in an equipment room, and in particular, to an electronic equipment cooling system with an auxiliary cooling device.

BACKGROUND

During operation, a component of electronic equipment generates heat, which leads to an increase of temperature of the component. If the temperature of the component goes beyond an operation range, electric performance of the component will be changed, and a fault may be caused in the component. Therefore, to ensure normal operation of the equipment, effective cooling must be performed on the equipment.

In the prior art, a server is a common type of electronic equipment and is usually installed in a 19-inch rack in a standard industrial cabinet. The cabinet has a front door and a rear door that can be opened rotationally, and there is a rack-type support structure inside the cabinet for installing a chassis of rack-type electronic equipment such as a server. After an electronic equipment chassis is installed on the rack, a certain gap exists between the electronic equipment chassis and a side board of the cabinet. The cabinet is generally placed in an equipment room environment with an air conditioner. The front door and the rear door of the cabinet have holes. Under the effect of a heat dissipation fan inside the electronic equipment chassis, a cooling airflow enters the electronic equipment chassis from the front door of the cabinet, passes through the electronic equipment chassis to dissipate heat for an electronic equipment inside the chassis, and then is expelled from the rear door of the cabinet, which forms a front-to-back air passage, so as to achieve an objective of dissipating heat for the equipment in the cabinet.

In the prior art, an electronic equipment chassis may be installed in the cabinet in parallel in a horizontal direction, or may be installed in the cabinet in parallel in a vertical direction. When the electronic equipment chassis are installed in the cabinet in parallel in the vertical direction, an electronic equipment chassis generally contains only one board, a fan is disposed inside the chassis, and a front-to-back direct ventilation air passage form is adopted, that is, a cooling airflow enters from a front board of the chassis and is expelled from a rear board. When the electronic equipment chassis are installed in a vertical insertion manner, an electronic equipment chassis generally contains multiple boards that share one chassis and fan tray. A lower part of the chassis is an air intake area shared by all boards, and an upper part of the chassis is a space for installing the fan tray and an air expelling area, where a passage of a " ⌐ " shape is adopted, that is, a cooling airflow enters from a lower front side of the chassis and is expelled from an upper back side of the chassis.

In the prior art, each component on an electronic equipment board emits a different volume of heat. Generally speaking, a component with large heat emission needs a large volume of cooling air, and a component with small heat emission needs a small volume of cooling air. However, in an existing electronic equipment cooling system, a uniform cooling airflow is provided for the chassis, and air volume allocation is improper, which causes that the component with large heat emission cannot be cooled effectively.

In the prior art, for the component with large heat emission, there also is a solution of using an air-guiding duct to directly connect the component to the fan, so as to ensure heat dissipation of the component. An airflow is heated by a component and then is expelled to a rear part to dissipate heat for another component. In such a heat dissipation structure, a cooling airflow for a rear component is heated by a front component, which reduces a cooling effect for the rear component and may form a new heat dissipation bottleneck.

In the prior art, from the perspective of heat management of an equipment room, in an underfloor air supply equipment room, cabinets are mostly deployed in a form of cold and hot ducts. Air from an air conditioner enters a raised floor and is delivered to an inlet side of an electronic equipment chassis through a perforated floor in a cold duct. After passing through the electronic equipment chassis, hot air is expelled to a hot duct and returned to the air conditioner for re-cooling. However, when the power of a single cabinet exceeds 4 kilowatts (kw), because a cooling air volume is insufficient, the hot air in the hot duct flows back to the cold duct from the top of the cabinet, and a temperature difference between a top inlet and a bottom inlet of the cabinet increases, so that inlet temperature of an electronic equipment chassis at an upper part of the cabinet is too high, and a problem of overheating of inlet temperature occurs.

Therefore, the defects of an electronic equipment system in the prior art include: air volume allocation is improper, and a component with high heat emission cannot be cooled effectively; cascading of components of a front-to-back air passage leads to a poor cooling effect of a rear component; and an electronic equipment on an upper part of a cabinet has a problem of overheating caused by excessively high inlet temperature.

SUMMARY

Embodiments of the present invention provide an electronic equipment cooling system with an auxiliary cooling device, where the electronic equipment cooling system uses its own auxiliary cooling device to cool a component with large heat emission inside an electronic equipment chassis, so that the component with high heat emission can be cooled effectively without affecting cooling effects of other components, and meanwhile, a problem of overheating can be effectively solved.

An electronic equipment cooling system with an auxiliary cooling device in an embodiment of the present invention includes: a cabinet; at least one electronic equipment chassis, where the at least one electronic equipment chassis is installed inside the cabinet; and an auxiliary cooling device, where the auxiliary cooling device includes an air pressurizing device, an air supply plenum box, and an air-guiding device. The air supply plenum box is disposed on an inner side of the cabinet. The air pressurizing device is disposed at the top or bottom of the cabinet, and an air exhaust on a sidewall of the air pressurizing device is connected to a corresponding air intake on a sidewall of the air supply plenum box. The air-guiding device is installed inside the electronic equipment chassis, an air intake of the air-guiding device is connected to an air exhaust of the air supply plenum device, and an air exhaust of the air-guiding device faces a component inside the electronic equipment chassis.

It can be seen from the foregoing technical solutions that, the embodiments of the present invention have the following advantages:

An auxiliary cooling device is installed in an electronic equipment system to dissipate heat for a heat-emitting component inside an electronic equipment chassis, which effectively solves a problem that a component with high heat emission cannot be cooled effectively due to improper air volume allocation without affecting cooling effects of other components. Meanwhile, an air-guiding device in the auxiliary cooling device is used to convey a low-temperature cooling airflow into the electronic equipment chassis, which can effectively keep the temperature of a cooling airflow for a component inside an electronic equipment chassis at an upper part of a cabinet within a proper range and solve a problem of overheating caused by high inlet temperature of a main cooling airflow for the chassis at the upper part of the cabinet.

DETAILED DESCRIPTION

Embodiments of the present invention provide an electronic equipment cooling system with an auxiliary cooling device, where the electronic equipment cooling system uses its own auxiliary cooling device to cool a component with large heat emission inside an electronic equipment chassis, so that the component with large heat emission can be cooled effectively without affecting cooling effects of other components. Meanwhile, an inlet temperature of a component inside an electronic equipment chassis at an upper part of a cabinet can be kept within a proper range, and a problem of overheating is solved.

In an embodiment of the present invention, an electronic equipment cooling system with an auxiliary cooling device includes at least one electronic equipment chassis, a cabinet for installing the electronic equipment chassis, and an auxiliary cooling device for dissipating heat for a component inside the electronic equipment chassis. The auxiliary cooling device includes an air pressurizing device, an air supply plenum box, and an air-guiding device. The air supply plenum box is disposed on an inner side of the cabinet. The air pressurizing device is disposed at the top or bottom of the cabinet, and an air exhaust on a sidewall of the air pressurizing device is connected to a corresponding air intake on a sidewall of the air supply plenum box, so as to form a passage. The air-guiding device is installed inside the electronic equipment chassis, an air intake of the air-guiding device is connected to an air exhaust of the air supply plenum device, and an air exhaust of the air-guiding device faces the component inside the electronic equipment chassis, so that the auxiliary cooling device can perform heat dissipation processing on the component inside the electronic equipment chassis.

To better understand the electronic equipment cooling system with an auxiliary cooling device in the embodiment of the present invention, the following describes an electronic equipment cooling system in the prior art.

Figure 1A:
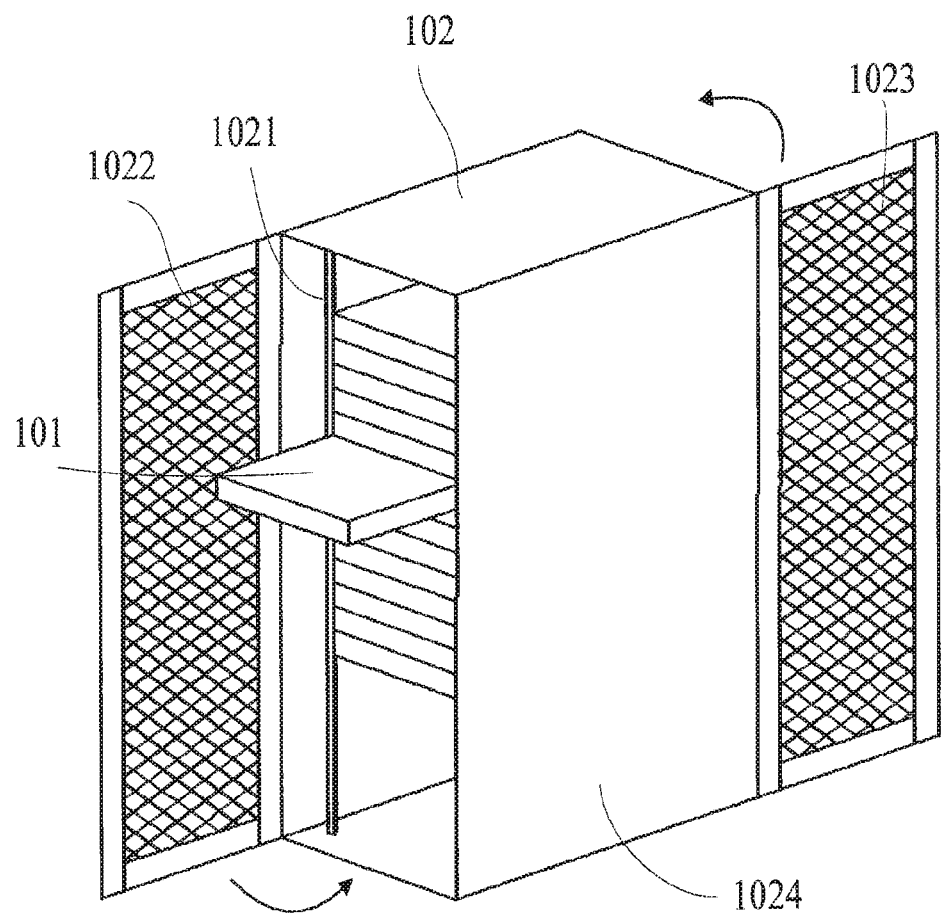
FIG. 1A is a structural diagram of an electronic equipment cooling system when electronic equipment chassis are installed in parallel in a vertical direction in the prior art.
Figure 1B:
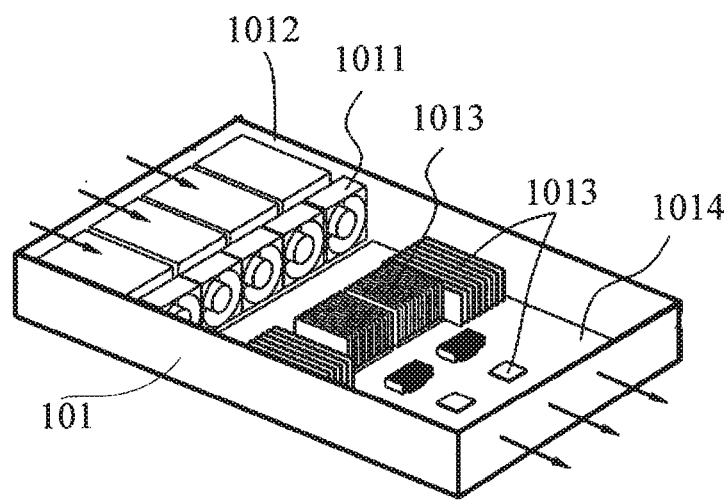
FIG. 1B is an internal structural diagram of an electronic equipment chassis in the prior art.

A case where electronic equipment chassis are installed in a cabinet in parallel in a vertical direction is used as an example. Refer to FIG. 1A and FIG. 1B, which are structural diagrams of an electronic equipment cooling system in the prior art and an internal structural diagram of an electronic equipment chassis 101 in the prior art, respectively.

In the prior art, the electronic equipment cooling system includes an electronic equipment chassis 101 and a cabinet 102. The cabinet 102 includes a rack column 1021, a front door 1022, a rear door 1023, and a sidewall 1024. Through-holes are provided on the front door 1022 and the rear door 1023; electronic equipment chassis 101 are installed in the cabinet 102 in parallel in the vertical direction; a cooling airflow can enter the cabinet 102 from through-holes on the front door 1022 and cool a component inside the electronic equipment chassis 101, and then flow out of through-holes on the rear door 1023. It should be noted that, an air supply passage of the cooling airflow is a main passage of an airflow in the electronic equipment cooling system. Directions of arrows in the structural diagram of the cabinet shown in FIG. 1B are closing directions of the front door 1022 and the rear door 1023 of the cabinet, respectively.

In an embodiment of the present invention, an electronic equipment chassis 101 includes its own cooling fan 1011, a chassis 1012, a component 1013, and a board 1014. The component 1013 is installed on board 1014, the cooling fan 1011 brings a cooling airflow from an outside environment into the chassis 1012, and the cooling airflow performs heat dissipation processing on the components 1013 and then flows out of the chassis 1012. In the structural diagram of the electronic equipment chassis 101 shown in FIG. 1B, a direction of an arrow represents a flow direction of the cooling airflow.

Figure 1C:
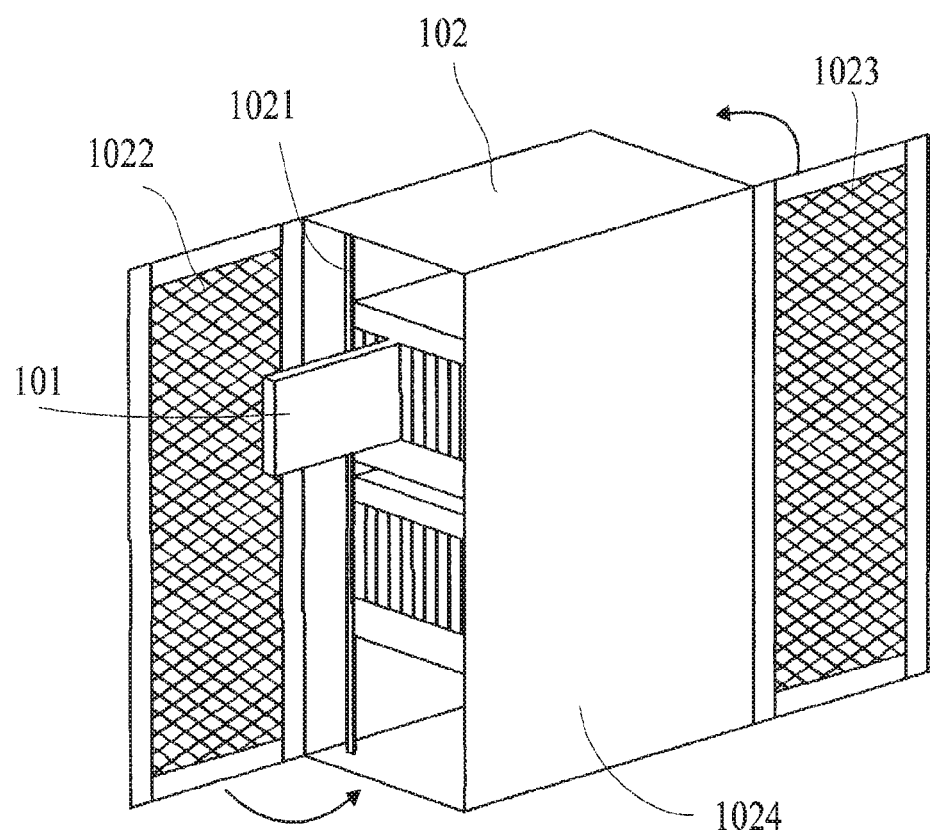
FIG. 1C is a structural diagram of an electronic equipment cooling system when electronic equipment chassis are installed in parallel in a horizontal direction in the prior art.

Refer to FIG. 1C, which is a structural diagram of an electronic equipment cooling system when electronic equipment chassis are installed in parallel in a horizontal direction in the prior art.

In the embodiment of the present invention, the installation manner and the structure of an auxiliary cooling device vary with the installation manner of electronic equipment chassis. The following describes in detail an electronic equipment cooling system with an auxiliary cooling device in two installation manners, respectively.

Figure 2A:
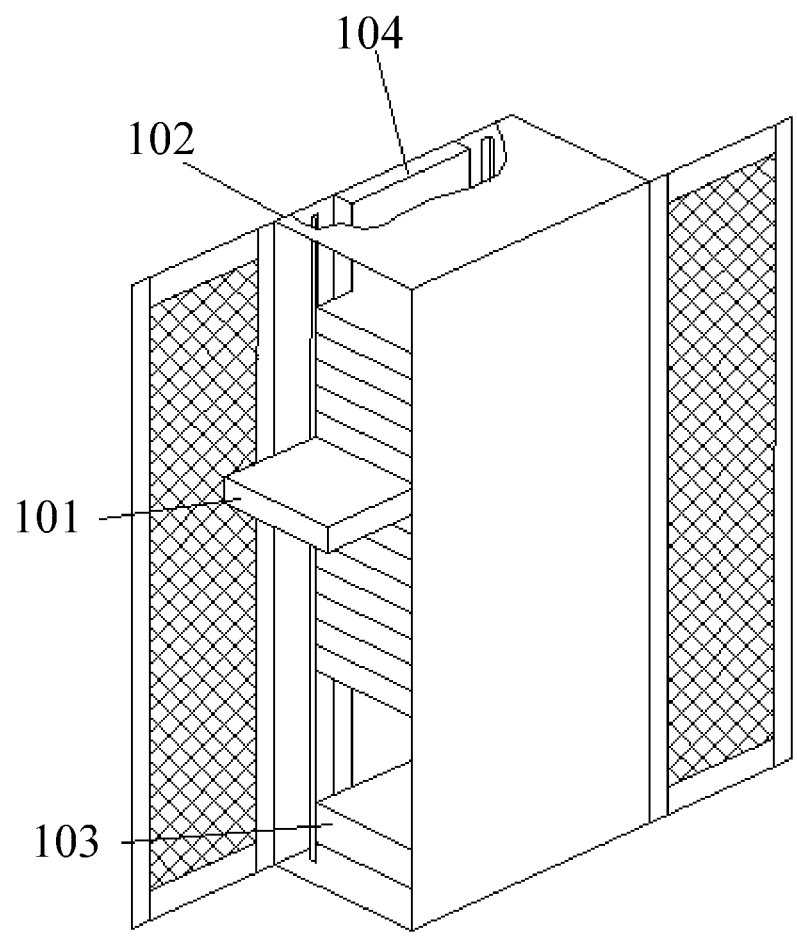
FIG. 2A is a structural diagram of an electronic equipment cooling system with an auxiliary cooling device according to an embodiment of the present invention.
Figure 2B:
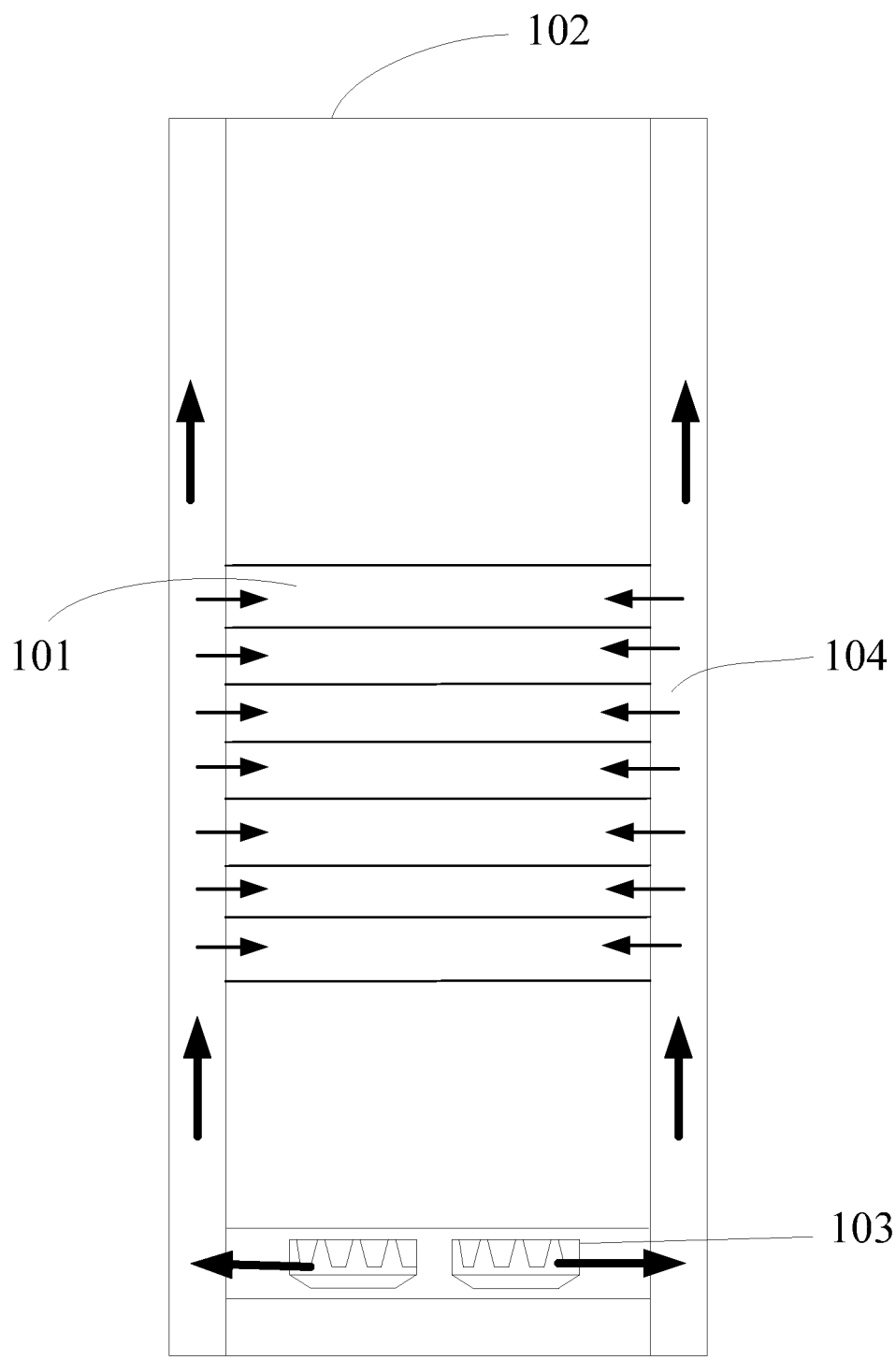
FIG. 2B is a front view of an electronic equipment cooling system with an auxiliary cooling device according to an embodiment of the present invention.

Refer to FIG. 2A, FIG. 2B, FIG. 3A, FIG. 3B, and FIG. 4. FIG. 2A is a structural diagram of an electronic equipment cooling system with an auxiliary cooling device when electronic equipment chassis are installed in parallel in a vertical direction, and FIG. 2B is a front view of an electronic equipment cooling system with an auxiliary cooling device according to an embodiment of the present invention, where a direction of an arrow is a flow direction of a cooling airflow in the auxiliary cooling device. It should be noted that, in one cabinet, one air supply plenum box may be installed, or two opposite air supply plenum boxes are installed. In the structural diagram shown in FIG. 2A, a case where one air supply plenum box is installed in the cabinet is used as an example; and in the front view shown in FIG. 2B, a case where two opposite air supply plenum boxes are installed is used as an example. In a practical application, the number of air supply plenum boxes may be set according to a specific situation and is not limited herein.

Figure 4:
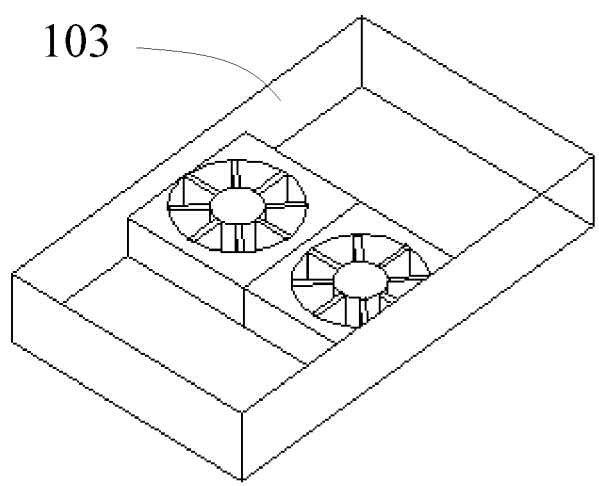
FIG. 4 is a structural diagram of an air pressurizing device according to an embodiment of the present invention.

In the embodiment of the present invention, the electronic equipment cooling system with an auxiliary cooling device includes at least one electronic equipment chassis 101, a cabinet 102 for installing the electronic equipment chassis, and an auxiliary cooling device for dissipating heat for a component inside the electronic equipment chassis. The auxiliary cooling device includes an air pressurizing device 103, an air supply plenum box 104, and a terminal device 105 (shown and labeled in FIG. 6). The air supply plenum box 104 is disposed on an inner side of the cabinet 102, the air pressurizing device 103 is disposed at the bottom of the cabinet, and an air exhaust on a sidewall of the air pressurizing device 103 is connected to a corresponding air intake on a sidewall of the air supply plenum box 104, so that the air pressurizing device can supply a cooling airflow into the air supply plenum box, so as to form a passage. Refer to FIG. 4, which is a structural diagram of the air pressurizing device 103 in the embodiment of the present invention.

In the embodiment of the present invention, a wedge-shaped through-hole that tapers off to the bottom or flares out to the bottom is provided on a sidewall of the air supply plenum box 104, and a wedge-shaped through-hole that tapers off to the bottom or flares out to the bottom is provided on a sidewall of the electronic equipment chassis 101. The wedge-shaped through-hole of the air supply plenum box 104 matches the wedge-shaped through-hole of the electronic equipment chassis 101, so as to form a gastight air supply connection structure.

In the embodiment of the present invention, the terminal device 105 is an air-guiding device, and an air intake of the terminal device 105 is connected to the wedge-shaped through-hole of the electronic equipment chassis 101. An air exhaust of the terminal device faces the component inside the electronic equipment chassis 101, so that the cooling airflow in the air supply plenum box 104 can dissipate heat for the component inside the electronic equipment chassis 101 through the terminal device 105.

Figure 3A:
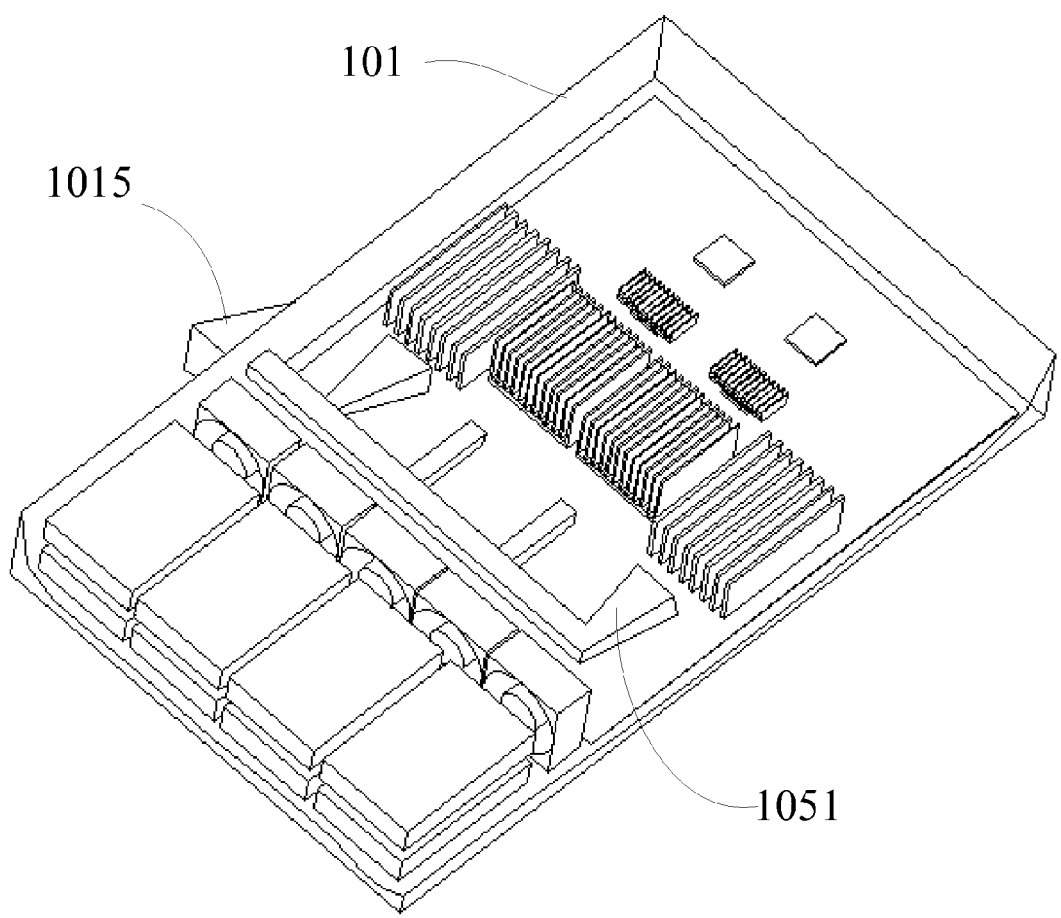
FIG. 3A is a structural diagram of an electronic equipment chassis having a wedge-shaped through-hole and installed with an impinging jet terminal device according to an embodiment of the present invention.
Figure 3B:
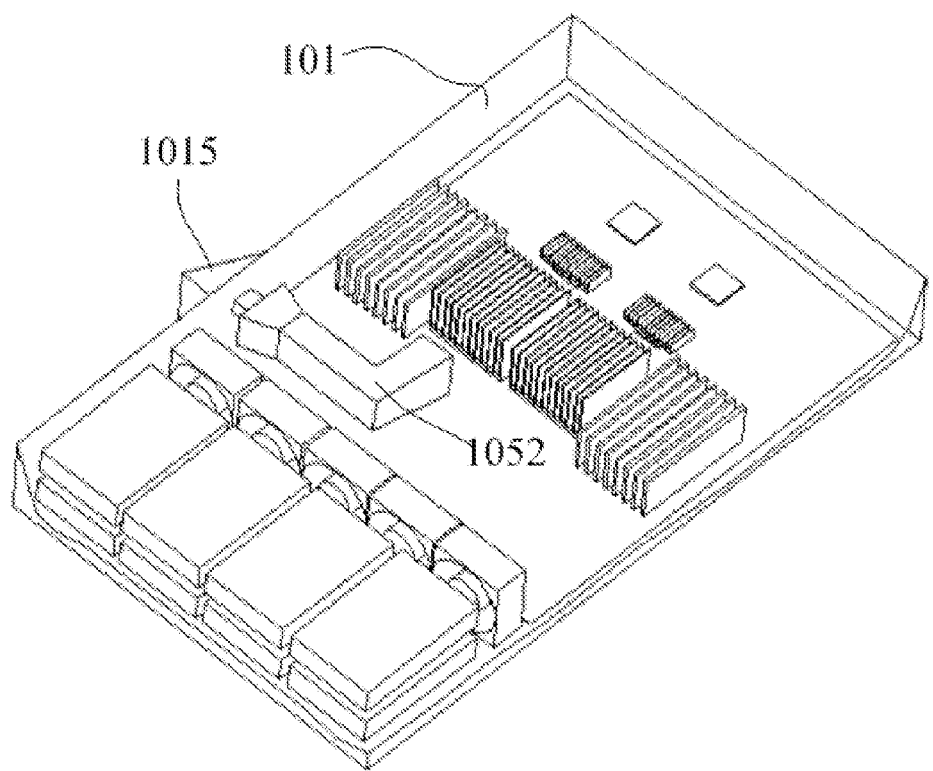
FIG. 3B is a structural diagram of an electronic equipment chassis having a wedge-shaped through-hole and installed with an entraining jet terminal device according to an embodiment of the present invention.

In the embodiment of the present invention, the terminal device 105 is an impinging jet terminal device 1051 or an entraining jet terminal device 1052. Refer to FIG. 3A, which is a structural diagram of an electronic equipment chassis having a wedge-shaped through-hole 1015 and installed with an impinging jet terminal device 1051 according to an embodiment of the present invention. Refer to FIG. 3B, which is a structural diagram of an electronic equipment chassis having a wedge-shaped through-hole 1015 and installed with an entraining jet terminal device 1052 according to an embodiment of the present invention.

In the embodiment of the present invention, when electronic equipment chassis 101 are installed in the cabinet 102 in parallel in the vertical direction, the air pressurizing device 103, the air supply plenum box 104, and the terminal device 105 form the auxiliary cooling device in the electronic equipment cooling system. An auxiliary cooling passage formed by the auxiliary cooling device can effectively perform cooling processing on a component with large heat emission. Specifically, the air pressurizing device 103 brings a cooling airflow from an outside environment; the cooling airflow is pressurized by the air pressurizing device 103 and then flows along a passage inside the air supply plenum box 104; and through an air supply passage formed between the air supply plenum box 104 and the electronic equipment chassis 101, the cooling airflow enters the terminal device 105 inside the electronic equipment chassis 101, flows out of the air exhaust of the terminal device 105, and then performs heat dissipation processing on the component facing the air exhaust.

In the structural diagrams shown in FIG. 2A and FIG. 2B, the structural diagram of the electronic equipment cooling system in the embodiment of the present invention is described by using an example where the air pressurizing device 103 is installed on an inner side of the bottom of the cabinet. Preferably, when an equipment room where the electronic equipment cooling system is located adopts an overhead air supply, the air pressurizing device 103 is installed at the top of the cabinet 102. When an equipment room where the electronic equipment cooling system is located adopts an underfloor air supply, the air pressurizing device 103 is installed at the bottom of the cabinet 102, and the air pressurizing device 103 may be installed on an outer or inner side of the cabinet. When the air pressurizing device 103 is installed on an outer side of the top or bottom of the cabinet, the air pressurizing device 103 is connected to the air supply plenum box 104 through a pipe, so as to form an air supply passage.

Preferably, in the embodiment of the present invention, when multiple cabinets 102 are placed side by side, the air pressurizing device 103 may be installed on an outer side of the multiple cabinets and use a pipe to convey cooling airflows to air supply plenum boxes inside the multiple cabinets.

In the embodiment of the present invention, an auxiliary cooling device formed of an air pressurizing device 103, an air supply plenum box 104, and a terminal device 105 is added to an electronic equipment cooling system to perform heat dissipation processing on a component with large heat emission in an electronic equipment chassis, so that the component with large heat emission can be cooled effectively without affecting heat dissipation effects of other components. Meanwhile, a cooling airflow flowing out of an air exhaust of the terminal device 105 can mix with a main cooling airflow at an inlet of the chassis to reduce the inlet temperature of a component, which effectively solves a problem of overheating caused by high inlet temperature of the chassis.

The following describes in detail a specific structure of an electronic equipment cooling system with an auxiliary cooling device when electronic equipment chassis are installed in parallel in a horizontal direction in an embodiment of the present invention.

Figure 5:
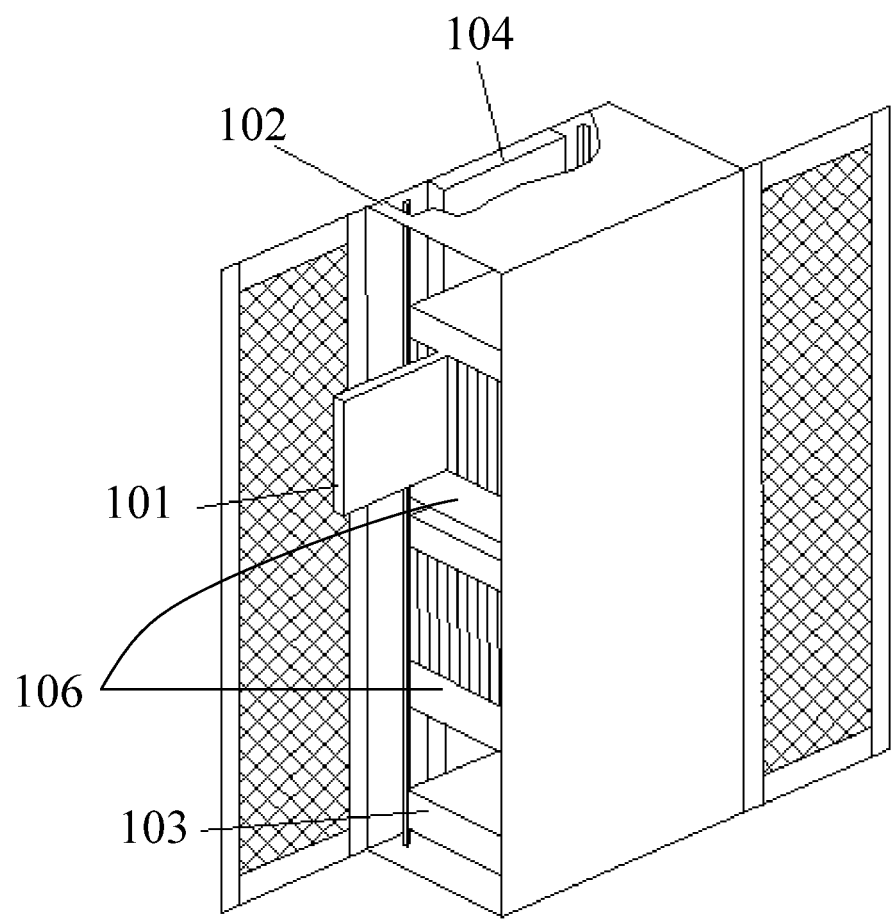
FIG. 5 is a structural diagram of an electronic equipment cooling system with an auxiliary cooling device according to an embodiment of the present invention.
Figure 6:
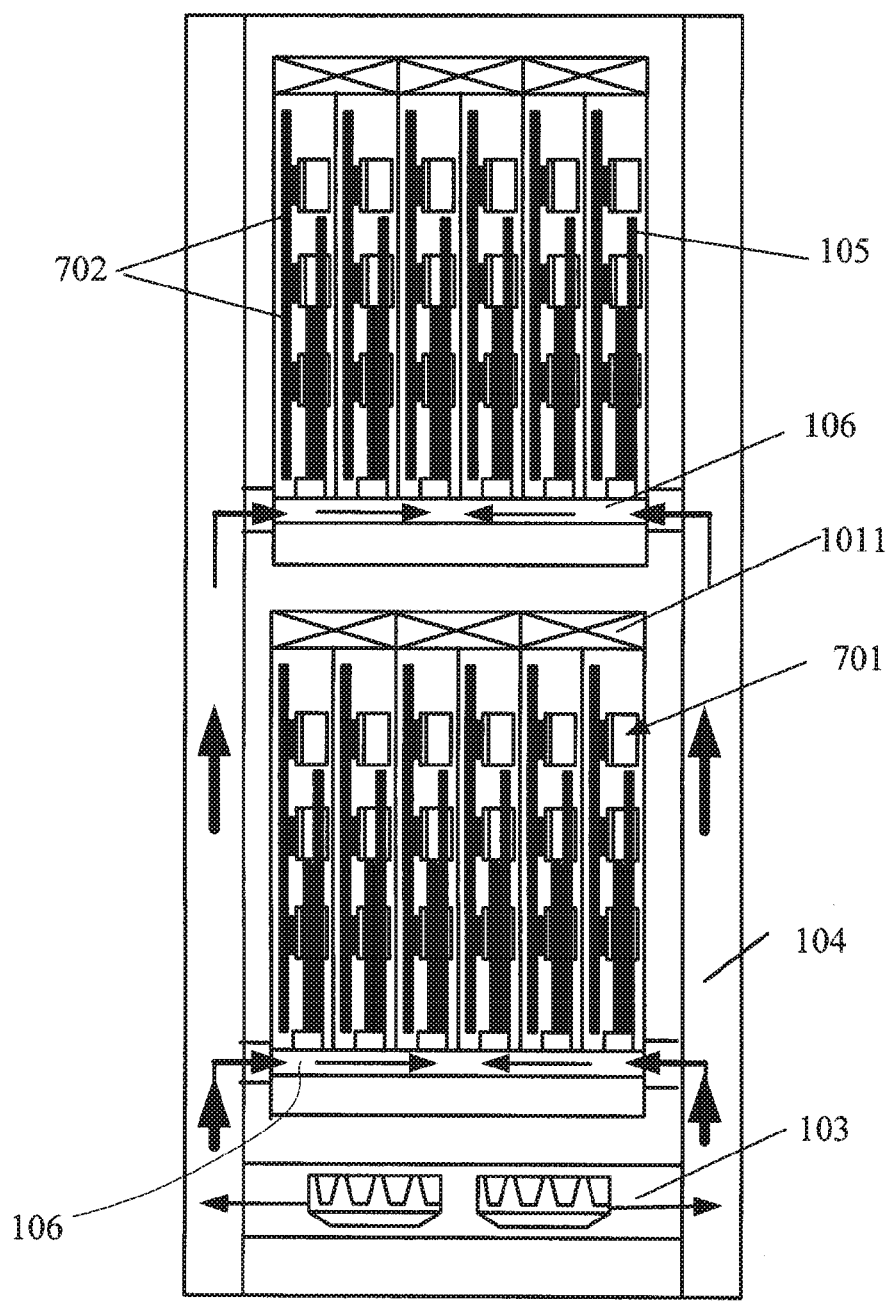
FIG. 6 is a front view of an electronic equipment system with an auxiliary cooling device according to an embodiment of the present invention.

Refer to FIG. 5, FIG. 4, and FIG. 6. FIG. 5 is a structural diagram of an electronic equipment cooling system with an auxiliary cooling device according to an embodiment of the present invention, including: at least one electronic equipment chassis 101, a cabinet 102 for installing the electronic equipment chassis 101, and an auxiliary cooling device for dissipating heat for a component inside the electronic equipment chassis 101, where the auxiliary cooling device includes an air pressurizing device 103, an air supply plenum box 104, and an air-guiding device, where the air-guiding device includes a terminal device 105 and an auxiliary air box 106.

The air supply plenum box 104 is disposed on an inner sidewall of the cabinet 102, the air pressurizing device 103 is disposed at the bottom of the cabinet 102, and an air exhaust on a sidewall of the air pressurizing device 103 is connected to a corresponding air intake on a sidewall of the air supply plenum box 104, so as to form a passage. Refer to FIG. 4, which is a structural diagram of the air pressurizing device 103 in the embodiment of the present invention.

In the embodiment of the present invention, the auxiliary air box 106 is installed in a lower air intake area of the electronic equipment chassis 101, an air intake on a sidewall of the auxiliary air box 106 is connected to a corresponding air exhaust on a sidewall of the air supply plenum box 104, so as to form an air supply passage. The terminal device 105 is installed inside the electronic equipment chassis 101, and an air intake of the terminal device 105 is connected to a corresponding air exhaust on a sidewall of the auxiliary air box 106, and an air exhaust of the terminal device 105 faces the component inside the electronic equipment chassis 101, so that the auxiliary cooling device can perform heat dissipation processing on the component inside the electronic equipment chassis 101.

In the embodiment of the present invention, the terminal device 105 is an impinging jet terminal device 1051 or an entraining jet terminal device 1052.

In the embodiment of the present invention, when electronic equipment chassis 101 are installed in the cabinet in parallel in the horizontal direction, the air pressurizing device 103, the air supply plenum box 104, the terminal device 105, and the auxiliary air box 106 form the auxiliary cooling device in the electronic equipment cooling system. An auxiliary cooling passage formed by the auxiliary cooling device can effectively perform heat dissipation processing on a component with large heat emission. Specifically, the air pressurizing device 103 brings a cooling airflow from an outside environment; the cooling airflow is pressurized by the air pressurizing device 103 and then flows along a passage inside the air supply plenum box 104 into the auxiliary air box 106, enters the terminal device 105 through the auxiliary air box 106, flows out of the air exhaust of the terminal device 105, and then performs heat dissipation processing on the component facing the air exhaust.

In the structural diagram shown in FIG. 5, the structural diagram of the electronic equipment cooling system in the embodiment of the present invention is described by using an example where the air pressurizing device 103 is installed on an inner side of the bottom of the cabinet. Preferably, when an equipment room where the electronic equipment cooling system is located adopts an overhead air supply, the air pressurizing device 103 is installed at the top of the cabinet 102. When an equipment room where the electronic equipment cooling system is located adopts an underfloor air supply, the air pressurizing device 103 is installed at the bottom of the cabinet 102, and the air pressurizing device 103 may be installed on an outer or inner side of the cabinet. When the air pressurizing device 103 is installed on an outer side of the top or bottom of the cabinet, the air pressurizing device 103 is connected to the air supply plenum box 104 through a pipe, so as to form an air supply passage.

Preferably, in the embodiment of the present invention, when multiple cabinets 102 are placed side by side, the air pressurizing device 103 may be installed on an outer side of the multiple cabinets and use a pipe to convey cooling airflows to air supply plenum boxes inside the multiple cabinets.

To better understand the technical solution in the embodiment of the present invention, refer to FIG. 6, which is a front view of an electronic equipment cooling system with an auxiliary cooling device when electronic equipment chassis are installed in a cabinet in parallel in a horizontal direction according to an embodiment of the present invention, where a direction of an arrow is a flow direction of a cooling airflow in the auxiliary cooling device, 702 is a board, and 701 is a component installed on the board 702.

In the embodiment of the present invention, an auxiliary cooling device includes an air pressurizing device 103, an air supply plenum box 104, a terminal device 105, a cooling fan 1011, and an auxiliary air box 106. By using the auxiliary cooling device, heat dissipation processing can be effectively performed on a component with large heat emission inside an electronic equipment chassis in the electronic equipment cooling system, so that the component with large heat emission can be effectively cooled without affecting heat dissipation effects of other components. Meanwhile, a cooling airflow flowing out of an air exhaust of the terminal device 105 can mix with a main cooling airflow at an inlet of the chassis to reduce the inlet temperature of a component, which effectively solves a problem of overheating caused by high inlet temperature of the chassis.

It should be understood that, persons of ordinary skill in the art may make improvements or variations according to the foregoing descriptions, and all such improvements and variations shall fall within the protection scope of the claims of the present invention.

Detailed above is the electronic equipment cooling system with an auxiliary cooling device that is provided by the present invention. Persons of ordinary skill in the art may make modifications to the specific implementation manners and application scopes according to the ideas of the embodiments of the present invention. In conclusion, the content of this specification shall not be construed as a limitation to the present invention.

What is claimed is:

1. An electronic equipment cooling system, comprising:
   a cabinet;
   at least one electronic equipment chassis that is installed inside the cabinet; and
   an auxiliary cooling device that comprises an air pressurizing device, an air supply plenum box, and an air-guiding device,
   wherein the air supply plenum box is disposed on an inner side of the cabinet,
   wherein the air pressurizing device is disposed at a top or a bottom of the cabinet,
   wherein an air exhaust on a sidewall of the air pressurizing device is connected to a corresponding air intake on a sidewall of the air supply plenum box,
   wherein the air-guiding device is installed inside the electronic equipment chassis,
   wherein an air intake of the air-guiding device is connected to an air exhaust of the air supply plenum device,
   wherein an air exhaust of the air-guiding device faces a component inside the electronic equipment chassis, wherein when there are multiple electronic equipment chassis, the electronic equipment chassis are installed in the cabinet in parallel in a vertical direction, and the air-guiding device is a terminal device, wherein a wedge-shaped through-hole that tapers off to the bottom or flares out to the bottom is provided on the sidewall of the air supply plenum box, and a wedge-shaped through-hole that tapers off to the bottom or flares out to the bottom is provided on a sidewall of the electronic equipment chassis, wherein the wedge-shaped through-hole of the air supply plenum box matches the wedge-shaped through-hole of the electronic equipment chassis to form a gastight air supply connection structure, and wherein an air intake of the terminal device is connected to the wedge-shaped through-hole of the electronic equipment chassis, and an air exhaust of the terminal device faces the component inside the electronic equipment chassis.

2. The system according to claim 1, wherein the terminal device is an impinging jet terminal device.

3. The system according to claim 1, wherein the terminal device is an entraining jet terminal device.

4. The system according to claim 1, wherein the air pressurizing device is installed at the top of the cabinet when an equipment room where the system is located adopts an overhead air supply, and wherein the air pressurizing device is installed at the bottom of the cabinet when the equipment room where the system is located adopts an underfloor air supply.

5. The system according to claim 4, wherein the air pressurizing device is installed on an outer side or an inner side of the cabinet.

6. The system according to claim 5, wherein the air exhaust of the air pressurizing device is connected to the air supply plenum box through a pipe to form an air supply passage when the air pressurizing device is installed on the outer side of the cabinet.

7. The system according to claim 6, wherein when there are multiple cabinets, the multiple cabinets are placed side by side, and the air pressurizing device is installed on an outer side of the multiple cabinets and uses the pipe to convey cooling airflows to air supply plenum boxes inside the multiple cabinets.

8. An electronic equipment cooling system, comprising:
a cabinet;
at least one electronic equipment chassis that is installed inside the cabinet; and
an auxiliary cooling device that comprises an air pressurizing device, an air supply plenum box, and an air-guiding device,
wherein the air supply plenum box is disposed on an inner side of the cabinet,
wherein the air pressurizing device is disposed at a top or a bottom of the cabinet,
wherein an air exhaust on a sidewall of the air pressurizing device is connected to a corresponding air intake on a sidewall of the air supply plenum box,
wherein the air-guiding device is installed inside the electronic equipment chassis,
wherein an air intake of the air-guiding device is connected to an air exhaust of the air supply plenum device,
wherein an air exhaust of the air-guiding device faces a component inside the electronic equipment chassis,
wherein when there are multiple electronic equipment chassis, the electronic equipment chassis are installed in the cabinet in parallel in a horizontal direction, and the air-guiding device comprises an auxiliary air box and a terminal device,
wherein the auxiliary air box is installed in a lower air intake area of the electronic equipment chassis, and an air intake on a sidewall of the auxiliary air box is connected to an air exhaust on a sidewall of the air supply plenum box to form an air supply passage, and
wherein the terminal device is installed inside the electronic equipment chassis, an air intake of the terminal device is connected to a corresponding air exhaust on a sidewall of the auxiliary air box, and an air exhaust of the terminal device faces the component inside the electronic equipment chassis.

9. The system according to claim 8, wherein the terminal device is an impinging jet terminal device.

10. The system according to claim 8, wherein the terminal device is an entraining jet terminal device.

11. The system according to claim 8, wherein the air pressurizing device is installed at the top of the cabinet when an equipment room where the system is located adopts an overhead air supply, and wherein the air pressurizing device is installed at the bottom of the cabinet when the equipment room where the system is located adopts an underfloor air supply.

12. The system according to claim 11, wherein the air pressurizing device is installed on an outer side or an inner side of the cabinet.

13. The system according to claim 12, wherein the air exhaust of the air pressurizing device is connected to the air supply plenum box through a pipe to form an air supply passage when the air pressurizing device is installed on the outer side of the cabinet.

14. The system according to claim 13, wherein when there are multiple cabinets, the multiple cabinets are placed side by side, and the air pressurizing device is installed on an outer side of the multiple cabinets and uses the pipe to convey cooling airflows to air supply plenum boxes inside the multiple cabinets.

* * * * *